(12) United States Patent
Glidden et al.

(10) Patent No.: US 8,461,620 B2
(45) Date of Patent: Jun. 11, 2013

(54) LASER PUMPING OF THYRISTORS FOR FAST HIGH CURRENT RISE-TIMES

(75) Inventors: Steven C. Glidden, Dryden, NY (US); Howard D. Sanders, Batavia, IL (US)

(73) Assignee: Applied Pulsed Power, Inc., Freeville, NY (US)

( * ) Notice: Subject to any disclaimer, the term of this patent is extended or adjusted under 35 U.S.C. 154(b) by 42 days.

(21) Appl. No.: 13/111,170

(22) Filed: May 19, 2011

(65) Prior Publication Data

US 2011/0284920 A1 Nov. 24, 2011

Related U.S. Application Data

(60) Provisional application No. 61/347,126, filed on May 21, 2010.

(51) Int. Cl.
*H01L 27/102* (2006.01)
(52) U.S. Cl.
USPC ........... 257/116; 257/355; 257/139; 257/356; 257/E27.079; 257/E25.015; 438/135; 438/139; 438/133; 438/22; 438/134
(58) Field of Classification Search
USPC .................. 257/116, E27.079, 355, E25.015, 257/139, 356; 438/135, 139, 133, 22, 134
See application file for complete search history.

(56) References Cited

U.S. PATENT DOCUMENTS

| | | | |
|---|---|---|---|
| 4,150,391 | A | 4/1979 | Jaecklin |
| 4,207,583 | A | 6/1980 | Temple |
| 4,910,156 | A | 3/1990 | Takasu et al. |
| 4,927,772 | A | 5/1990 | Arthur et al. |
| 6,218,682 | B1 | 4/2001 | Zucker et al. |
| 6,624,684 | B2 | 9/2003 | Glidden |
| 7,002,188 | B2 | 2/2006 | Weidenheimer et al. |
| 7,072,196 | B1 | 7/2006 | Glidden et al. |
| 7,696,528 | B2 | 4/2010 | Kellner-Werdehausen et al. |
| 2001/0010379 | A1* | 8/2001 | Yoshida et al. ............... 257/355 |
| 2005/0001332 | A1* | 1/2005 | Giorgi et al. .................. 257/918 |
| 2011/0233380 | A1* | 9/2011 | Sheu .............................. 250/206 |

* cited by examiner

*Primary Examiner* — Cathy N Lam
(74) *Attorney, Agent, or Firm* — Brown & Michaels, PC

(57) ABSTRACT

An optically triggered semiconductor switch includes an anode metallization layer; a cathode metallization layer; a semiconductor between the anode metallization layer and the cathode metallization layer and a photon source. The semiconductor includes at least four layers of alternating doping in the form P-N-P-N, in which an outer layer adjacent to the anode metallization layer forms an anode and an outer layer adjacent the cathode metallization layer forms a cathode and in which the anode metallization layer has a window pattern of optically transparent material exposing the anode layer to light. The photon source emits light having a wavelength, with the light from the photon source being configured to match the window pattern of the anode metallization layer.

23 Claims, 15 Drawing Sheets

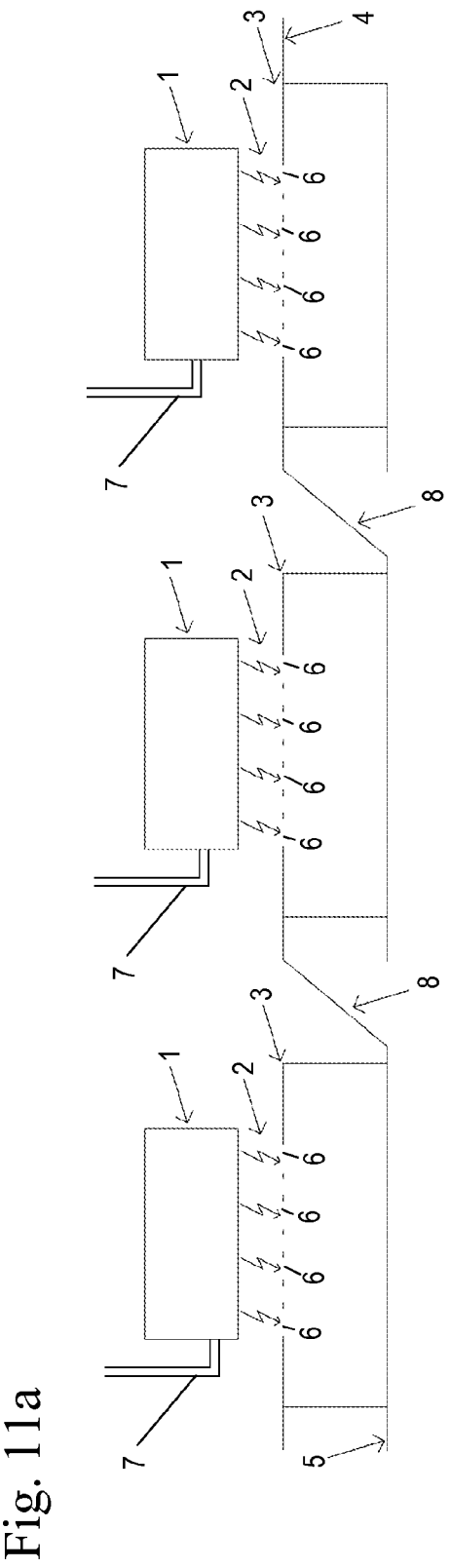

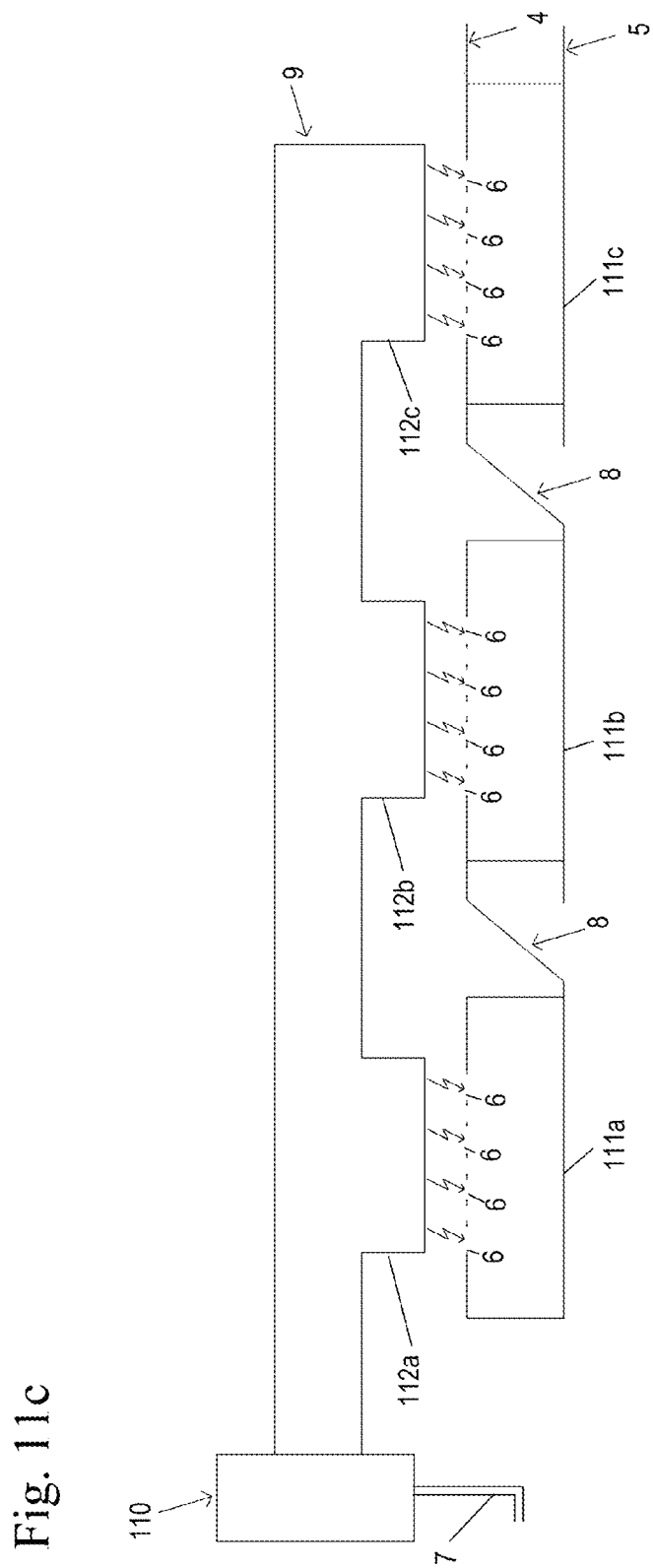

LASER PUMPING OF THYRISTORS FOR FAST HIGH CURRENT RISE-TIMES

REFERENCE TO RELATED APPLICATIONS

This application claims one or more inventions which were disclosed in Provisional Application No. 61/347,126 filed May 21, 2010, entitled "Laser Pumping of 5 kV Silicon Thyristors for Fast High Current Rise-Times". The benefit under 35 USC §119(e) of the United States provisional application is hereby claimed, and the aforementioned application is hereby incorporated herein by reference.

ACKNOWLEDGMENT OF GOVERNMENT SUPPORT

This invention was made with Government support under Grant No. DE-FG-02-08ER85188, awarded by the Department of Energy. The government has certain rights in the invention.

BACKGROUND OF THE INVENTION

1. Field of the Invention

The invention pertains to the field of switches for pulsed power applications. More particularly, the invention pertains to switches for pulsed power applications requiring high voltage blocking, high current density, compact size, low cost, high reliability, high efficiency, and fast current rise times.

2. Description of Related Art

Current commercial technology provides many semiconductor devices for switch applications. These include but are not limited to thyristors, such as the gate turn-off (GTO), metal-oxide-semiconductor gated (MOS-Gated) thyristor, and integrated gate-commutated thyristor (IGCT), and transistors, such as the insulated gate bipolar transistor (IGBT) and the metal-oxide-semiconductor field-effect transistor (MOSFET). Some of these devices have very fast turn-on times, very low resistance, or high voltage blocking capabilities. But none of them have the parameters required for some pulsed power applications, such as the ability to achieve 5 kV blocking, 5 kA peak with a turn-on time of less than 50 ns, and an on-state resistance less than 10 m$\Omega$, at a reliability and price suitable for sale in the commercial market.

A device with the lowest on-state resistance and highest current density is a thyristor. The thyristor is basically a four layer device having alternating doping structure in the form P-N-P-N. The first P is connected to the anode metal and the last N is connected to the cathode metal. Typically the second P is connected to the gate metal for silicon (Si) devices. For asymmetric devices, those which block only in one direction, the first N is the only thick layer.

The turn-on time of the device, when electrically controlled, is limited by the thickness of the layers, the shape of the gate structure, and the gate current. The thickness of the layers determines the transit time of the charge carriers which directly impacts the turn-on time. The greater length of the gate-cathode region per active area, the faster the turn on time. The interdigitated structure can achieve meters of gate-cathode length per cm$^2$ of active area, which is several orders of magnitude better than more common involute structures. These properties have been maximized in devices like the Solidtron, a GTO type thyristor, from Silicon Power Incorporated. The result is a device with a turn-on time greater than 200 ns. A slower device results in increased turn-on losses which means lower switching efficiency and higher thermal load.

Faster devices are being developed in two areas. One area is concerned with trying to develop faster devices with improved efficiency in power transmission or conversion. This area needs faster devices to reduce the turn-on losses, which become the more dominant loss factor as the on-state resistances have become very low. These devices can operate at very high frequency and average current, but have low peak currents.

The second area, to which this invention is applicable, is concerned with low-frequency, high-peak power applications. These applications include military defense, medical, and research fields. More specific examples could be radar, radiation therapy, or particle accelerators.

Based on the need for faster devices, much work is being directed toward creating switches for pulsed power applications. Some of that work involves using silicon carbide (SiC), gallium nitride (GaN), or other materials that can handle higher electric fields and therefore would have inherently faster operation. However these devices have very long development times and also high cost compared to standard Si devices. Many advances have been made with silicon devices improving turn-on time such as using highly interdigitated gate structures, laser triggering, and modified structures. One further method for improving turn-on time is optical pumping such as described by U.S. Pat. No. 4,207,583.

Laser pumping uses photons to generate charge carriers in a semiconductor device. Because of the regenerative properties of thyristors, once sufficient charge carriers are generated, the regenerative action will maintain sufficient charge carriers to conduct the current at the on-state resistance. So, optical pumping can allow a semiconductor device to turn-on as fast as the charge carriers can be photo-generated, rather than waiting for those charge carriers to be injected from the base region as is required for electrically or optically triggered semiconductor devices.

A limitation with laser pumping has been the cost and size of the required laser source. Previously solid state or gas lasers operating in the infrared (IR) range were used. These types of lasers are large and costly and were only usable in installation having sufficient space and resources. To be able to commercialize the devices, high-power, low-cost, pulsed, compact laser diode arrays needed to be developed. Normally laser diodes operate in or near continuous-wave (CW) operation at low peak power for applications like fiber-optic communication. Also, previously laser diodes were not produced with wavelengths appropriate for laser pumping Si thyristors.

Other attempts at laser pumped devices used thick silicon which is not a commercial material. Thick silicon also makes it harder to optimize the distribution of charge carriers throughout the device, as there is an imbalance between absorption and photon energy. If the laser wavelength is too long then the energy is below the band-gap and the photon cannot efficiently generate charge carriers. If the wavelength is too short then all of the light is absorbed in a thin layer and the charge carriers are not photo-generated throughout the device.

SUMMARY OF THE INVENTION

The present invention uses multiple stages of laser pumped semiconductors in series, based on a thyristor or equivalent design having regenerative charge carrier properties. The semiconductor and laser being specifically designed for optimum performance resulting in <50 ns current rise times.

In one embodiment, an optically triggered semiconductor switch includes an anode metallization layer; a cathode metallization layer; a semiconductor between the anode metallization layer and the cathode metallization layer and a photon source. The semiconductor includes at least four layers of alternating doping in the form P-N-P-N, in which an outer layer adjacent to the anode metallization layer forms an anode and an outer layer adjacent the cathode metallization layer forms a cathode and in which the anode metallization layer has a window pattern of optically transparent material exposing the anode layer to light. The photon source emits light having a wavelength, with the light from the photon source being configured to match the window pattern of the anode metallization layer.

In another embodiment, an multi-stage optically triggered semiconductor switch, includes a plurality of stages coupled in series, each comprising: an anode metallization layer; a cathode metallization layer; a semiconductor between the anode metallization layer and the cathode metallization layer, comprising at least four layers of alternating doping in the form P-N-P-N, in which an outer layer adjacent to the anode metallization layer forms an anode and an outer layer adjacent the cathode metallization layer forms a cathode and in which the anode metallization layer has a window pattern of optically transparent material exposing the anode layer to light and a photon source emitting light having a wavelength, the light emitted from the photon source being configured to match the window pattern of the anode metallization layer.

Alternatively, the cathode metallization layer may have the window pattern of optically transparent material exposing the cathode metallization layer to light and the photon source emits light having a wavelength, with the light from the photon source is configured to match the window pattern of the cathode metallization layer.

In another embodiment, both the cathode metallization layer and the anode metallization layer each have the window pattern of optically transparent material exposing the cathode metallization layer and the anode metallization layer to light and the photon source emits light having a wavelength, with the light from the photon source is configured to match the window pattern of the cathode metallization layer and the anode metallization layer.

BRIEF DESCRIPTION OF THE DRAWING

FIG. 11a shows a schematic of a horizontal configuration of optically gated switch devices of an embodiment of the present invention, with each optically gated switch device with a separate laser diode array.

FIG. 11c shows a schematic of a horizontal configuration of optically gated switch devices of an embodiment of the present invention, with a single laser diode connected to an optical waveguide to provide optical charging to all of the optically gated switch devices.

DETAILED DESCRIPTION OF THE INVENTION

Figure 1:
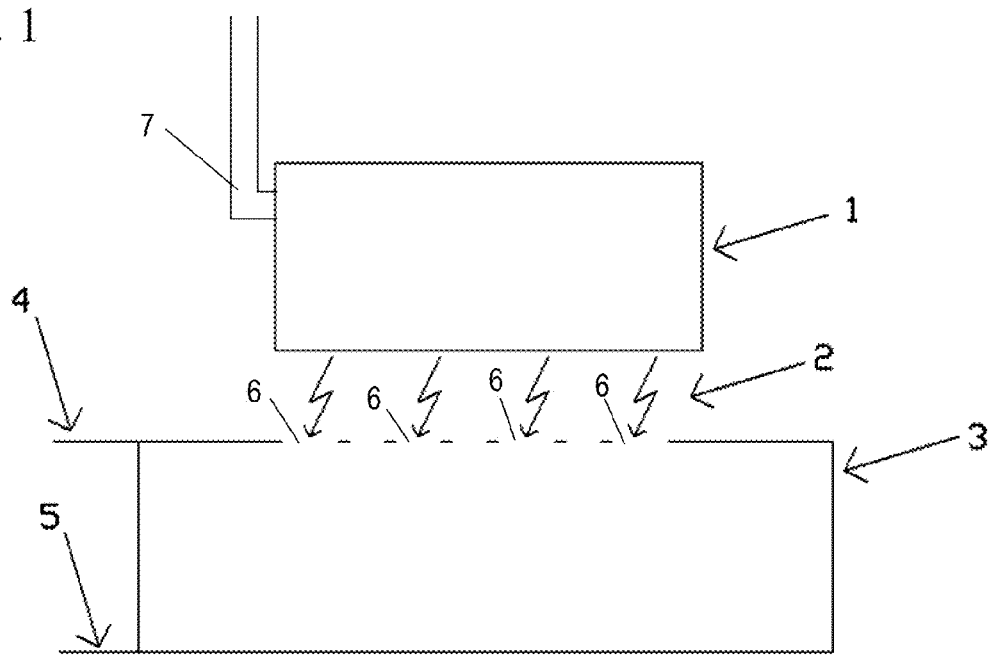
FIG. 1 shows a schematic of an optically gated switch device of an embodiment of the present invention.

FIG. 1 shows a schematic of an optically gated switch device or switch of an embodiment of the present invention. In the first embodiment, the photon source 1 is a laser diode array. The photons 2 travel from the photon source 1 to the thyristor 3 of the optically gated switch device. The photon source 1 can be located coplanar to the thyristor 3 or there can be some separation between the photon source 1 and the thyristor 3. In an alternate embodiment the photons 2 from the photon source 1 may travel through waveguides or fiber-optic cables from the photon source 1 to the thyristor 3.

The photons 2 enter through a surface of the thyristor 3 through optically flat openings or windows 6 patterned through the anode metallization 4 of the thyristor 3. The photons 2 will generate charge carriers (not shown) throughout the full thickness of the thyristor 3. Opposite the anode metallization 4 of the thyristor 3 is the cathode metallization 5. An external anode connection would be made to the anode metallization 4 and an external cathode connection would be made to the cathode metallization 5. Optical drive power would be provided through connections 7 at the photon source 1.

Figure 2:
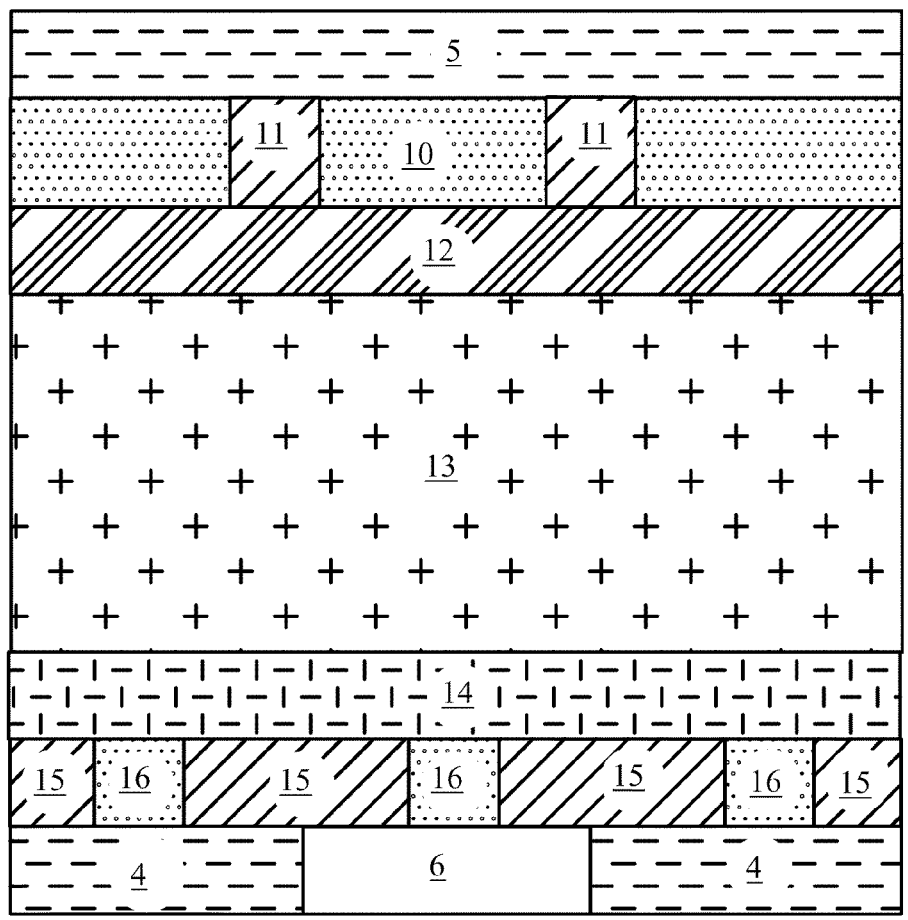
FIG. 2 shows a doping profile of the N and P regions of a four layered optically gated switch device of an embodiment of the present invention with windows in the anode side, cut along line 2-2 of FIG. 3.
Figure 3:
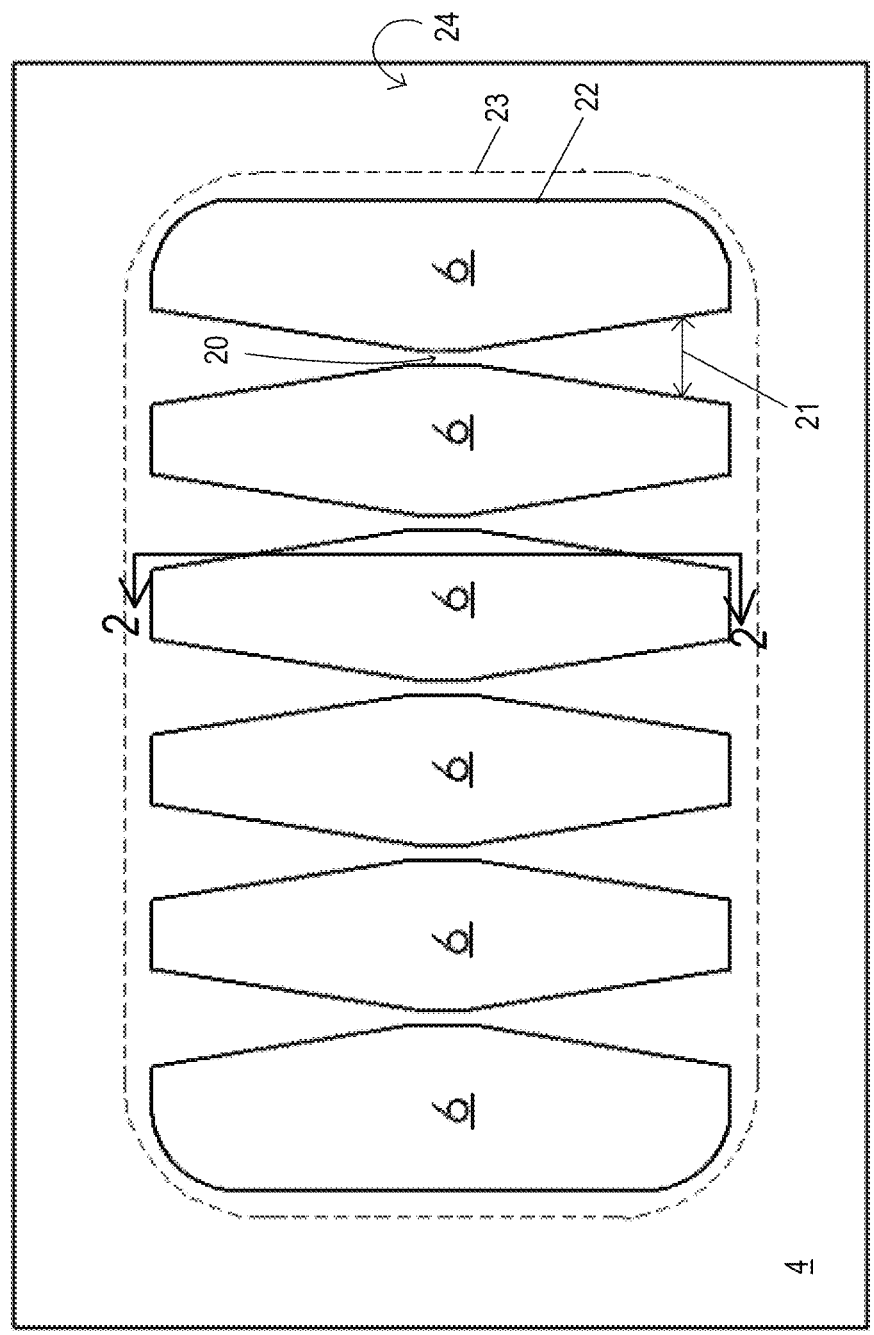
FIG. 3 shows a top down view of an anode side of an optically gated switch device of an embodiment of the present invention.

FIG. 2 shows an example of a doping profile of the N and P regions of a layered optically gated switch device of an embodiment of the present invention cut along line 2-2 of FIG. 3. In one embodiment, commercial techniques are used to process silicon 660 μm thick, neutron transmutation doped, 750 Ω-cm, N-type silicon. This material has been well developed and reliable with very low manufacturing costs. Thin highly doped layers are then created using standard commercial techniques.

As well as lower manufacturing costs, the use of relatively thin semiconductor wafers results in a more efficient switch. For example, a 20 kV switch composed of four, 5 kV switches connected in series will result in lower switching and conduction losses than a 20 kV switch fabricated from a single thick device.

The structure includes a cathode metallization 5, a cathode region 10 of N+ conductivity material, cathode shorts 11 of P+ conductivity material, a base region 12 of P− conductivity material, a drift region 13 of N− conductivity material, a buffer region 14 of N conductivity material, an anode region 15 of P+ conductivity material, an anode metallization 4, optically flat openings or windows 6 through the anode metallization 4, and anode shorts 16 of N+ conductivity material.

Above the anode metallization 4 and the opening 6 is an anode region 15 with thinner large area shorts 16. These large area shorts 16 discharge the first P-N junction. The anode region 15 may for example have a doping level of $1.0 \times 10^{25}$ m$^{-3}$, with a depth of 0.75 µm and doped in boron. The shorts 16 may for example have a doping level of $1.0 \times 10^{25}$ m$^{-3}$, with a depth of 0.5 µm and doped in phosphorus.

Below the cathode metallization 5 is a cathode region 10 with large area shorts 11 and a buried base region 12. The large area shorts 11 on the cathode side discharge a second P-N junction. The cathode region 10 may for example have a doping level of $1.0 \times 10^{26}$ m$^{-3}$, with a depth of 0.5 µm and doped in phosphorus. The shorts 11 may for example have a doping level of $1.0 \times 10^{25}$ m$^{-3}$, with a depth of 0.6 µm and doped in boron. The base region 12 may for example have a doping level of $3.3 \times 10^{22}$ m$^{-3}$, with a depth of 6 µm and doped in boron.

Below the base region 12 is a drift region 13, which may for example have a doping level of $1.0 \times 10^{19}$ m$^{-3}$, with a depth of 650 µm. Below the drift region 13, is a buffer 14, which may for example have a doping level of $6.0 \times 10^{22}$ m$^{-3}$ and a depth of 6 µm and doped in phosphorus.

The central N-P junction, between the base region 12 and the drift region 13 requires the charge to recombine which will limit the turn-off time of the device. Also on the cathode side are junction termination extensions 24 to grade the voltage across the surface of the device rather than across the thickness of the device. This allows the electric field outside of the device to be much lower than the field inside the device reducing the stress on the insulating material packaging the device.

Alternatively, the optically gated switch device may include four layer devices fabricated in other materials such as SiC and gallium arsenide (GaAs). Three layer devices can also be used, but require constant illumination to keep the devices in the on state.

Reverse conduction is an essential requirement for high power solid state switches. Most pulsed power systems will have load faults which results in reverse current. It is important that the switch survive these events as they typically represent a substantial portion of the system cost, and in causes where faults are self healing, it is often essential that the system operation is not interrupted.

While diodes can be used to control reverse current, they add to the cost and complexity of the system and do not completely prevent the switch from seeing reverse current because of the finite inductance of the connections between diode and switch and the turn-on and turn-off time for the diode. Therefore, it is desirable that the switches be able to conduct reverse current. Furthermore, designing the switch to be capable of conducting the full reverse current eliminates the need to add diodes.

One example of the optically flat openings 6 through the anode metallization 4 is shown in FIG. 3. The smaller neck 20 expands to a larger base 21 for the metallization remaining between openings 6. The outer edge 22 of the openings 6 is kept within the inner edge 23 of the cathode metallization 5 on the opposite side of the device as this defines the active area of the device. The area outside of the cathode metallization 5 on the cathode side, opposite the side shown in FIG. 3, of the device is the junction termination region 24 which grades the voltage across the top surface of the device rather than the thickness of the device allowing the device package to have lower electric field stress outside of the silicon.

In one embodiment, the openings 6 are preferably optically flat windows patterned through the anode metallization 4 of the optically gated switch device. The outer edge of the window pattern 22 would be equivalent to the inner edge of the junction termination region 25. This allows for the most metal contact on the cathode side which is restricted by the junction termination extension 24. The design opening pattern or window pattern takes into account the lateral resistance of the P type layer on the anode side. If the openings are too large then the current density will cause localized over-heating in that region which will damage the device. Making that layer thicker or less resistive in the same thickness actually increase the turn-on time or increase the amount of photons absorbed in that region which is not desired. Therefore, window pattern should expose as much as possible, while not being too large that the over-heating occurs.

In one embodiment, for example, the window pattern may have the following measurements, with the widest portion of the windows 6 being 0.25 mm apart at the neck 20, with the windows 6 closest to the outer edge 23 being 10.50 mm high and 2.75 mm wide at the middle portion of the window. The remaining windows 6 are 10.5 mm tall, 1.25 mm wide at the top and bottom portions and 2.81 mm wide at the middle portion of the window.

Figure 12:
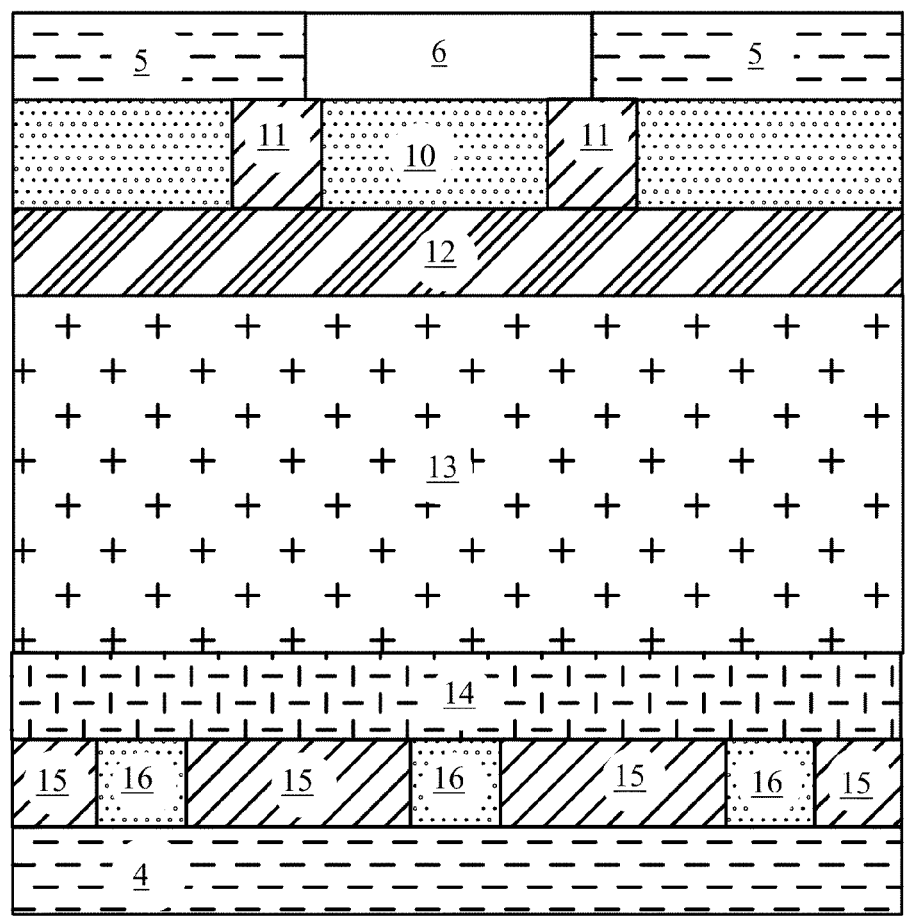
FIG. 12 shows a doping profile of the N and P regions of a four layered optically gated switch device of an alternate embodiment of the present invention with windows in the cathode side of the device.

In an alternate embodiment, the openings 6 are preferably optically flat windows patterned through the cathode metallization 5 of the optically gated switch device as shown in FIG. 12, rather than through the anode metallization 4 as shown in FIGS. 2 and 3 and discussed above. This has the advantage of allowing the entire anode side to be attached to the anode electrode and heat sink resulting in very low thermal impedance from device to heat sink. Encapsulation of the device to protect the termination region must accommodate the cathode-side window.

Figure 13:
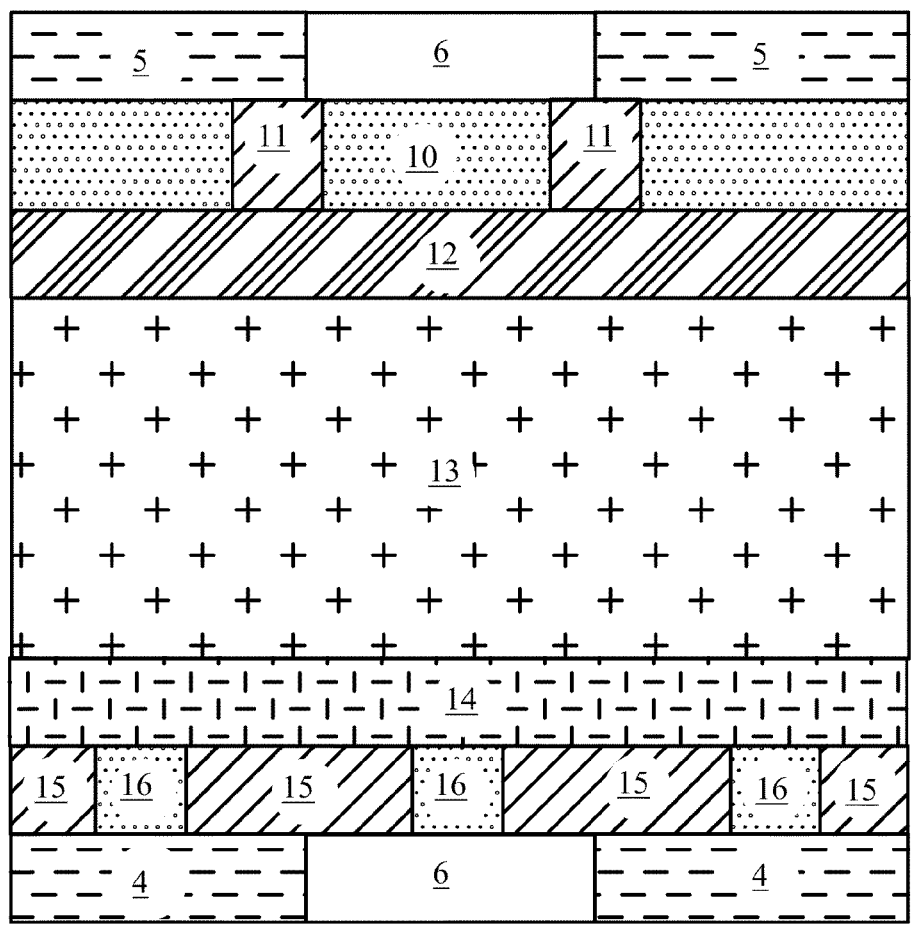
FIG. 13 shows a doping profile of the N and P regions of a four layered optically gated switch device of another embodiment of the present invention with windows in both the anode side and cathode side of the device.

In another embodiment, the openings 6 are preferably optically flat windows patterned through the cathode metallization 5 and the anode metallization 4 of the optically gated switch device as shown in FIG. 13. This allows the device to be pumped from either or both sides. With both sides of the device having windows, the device can increase the optical power delivered without having to increase the optical power density.

Additionally, it may be desirable to use anti-reflective coatings to improve the delivery of the optical energy to the optically gated switch device. Also, optical gels and other media can be placed between the photon source and the optically gated switch device, contacting the surfaces of both to improve the transfer of optical energy.

The openings 6 or windows in the metallization are designed to maximize the opening area while maintaining low resistance, low inductance connections. This can be accomplished by using metallization patterns that are narrow in the center of the device where the integrated current is small, and increase in size toward the edges as the total current conducted by the electrodes increases. This can be measured by modeling the current to determine the current density in the electrode at any point, therefore determining the required size of the electrode to prevent over heating. Grid designs with constant width conductors are not optimal, as the conductor width must be sufficient to carry large current densities at the edge of the device, making them much larger than necessary at its center, resulting in less available window area. Therefore, the required size of the electrode.

Figure 4:
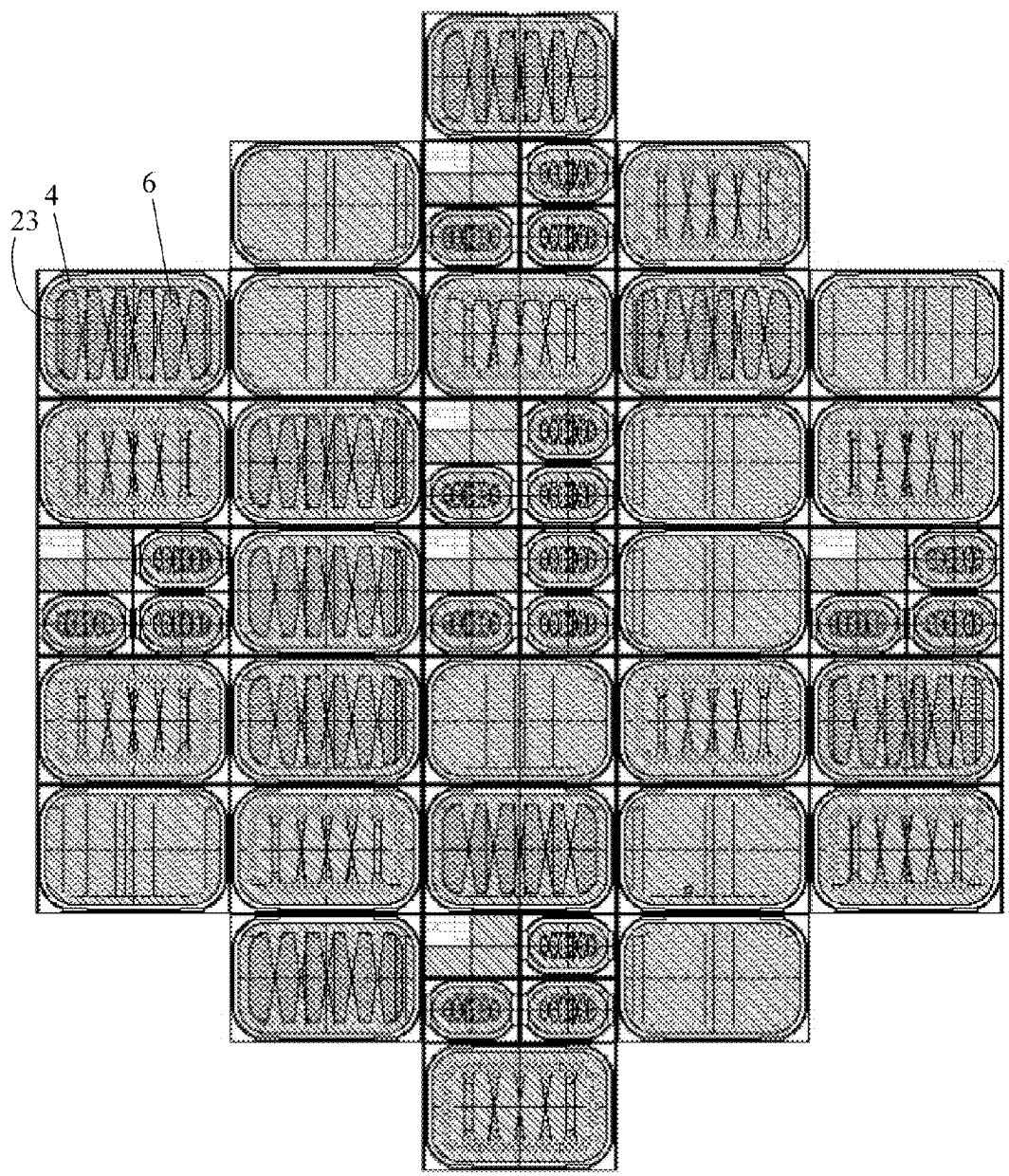
FIG. 4 shows a mask layout defining the optically gated switch device metallization for wafer with forty five optically gated switch devices.
Figure 5:
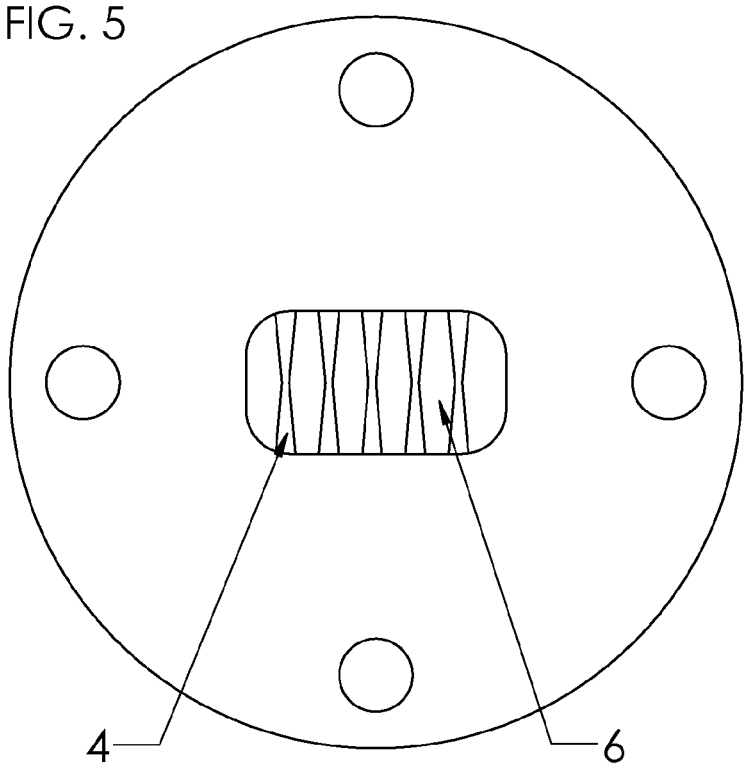
FIG. 5 shows is an anode side of an optically gated switch device of an embodiment of the present invention.

FIG. 4 shows an example of a mask pattern for processing the silicon wafer into devices. This mask pattern includes several individual masks including the edge of the cathode metallization 5 and the openings 6 in the anode metallization 4. The pattern on the anode side of an actual device can be seen in FIG. 5.

Use of standard silicon wafers allows many devices to be fabricated on a single wafer with conventional processing techniques and facilities, as can be seen in FIG. 4. As semiconductor device cost is dominated by wafer processing costs rather than material cost, this design lowers the cost of manufacturing. Because specialized processing is not required, manufacturing costs are further reduced and rapid scale up in volume is possible.

Figure 6:
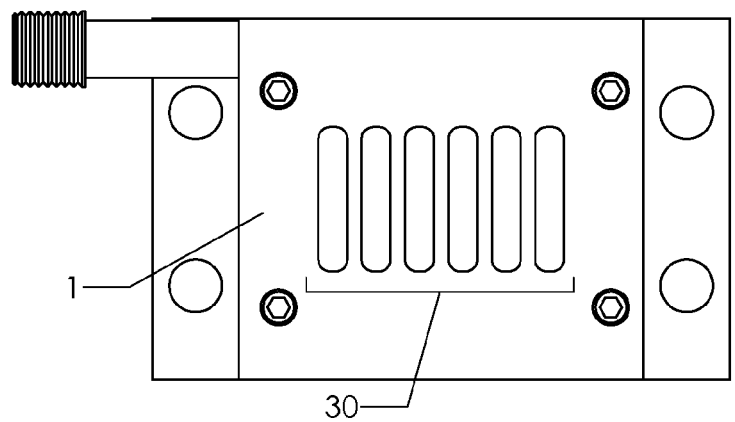
FIG. 6 shows a laser diode source of an embodiment of the present invention.

FIG. 6 shows an example laser diode array used as a photon source 1. The laser diode array is patterned to match the window pattern through the metallization on the anode side. In other words, the emitter pattern 30 of the photon source 1, in this case the laser diode array matches the openings 6 in the anode metallization 4 of the optically gated switch device. This prevents any of the photons from being reflected by metal on the anode side. The openings 6 or optically flat windows further reduce reflections from the interface. Some of the light will not be absorbed on the first pass and will be reflected by the metal on the cathode side.

For example, for an optically gated switch device that is only 660 μm thick, the transit time of a photon is less than 10 ps, so using multiple passes will not affect turn-on time. It is then possible to achieve a high degree of absorption in the device with charge carriers distributed throughout the thickness of the optically gated switch device.

Figure 7:
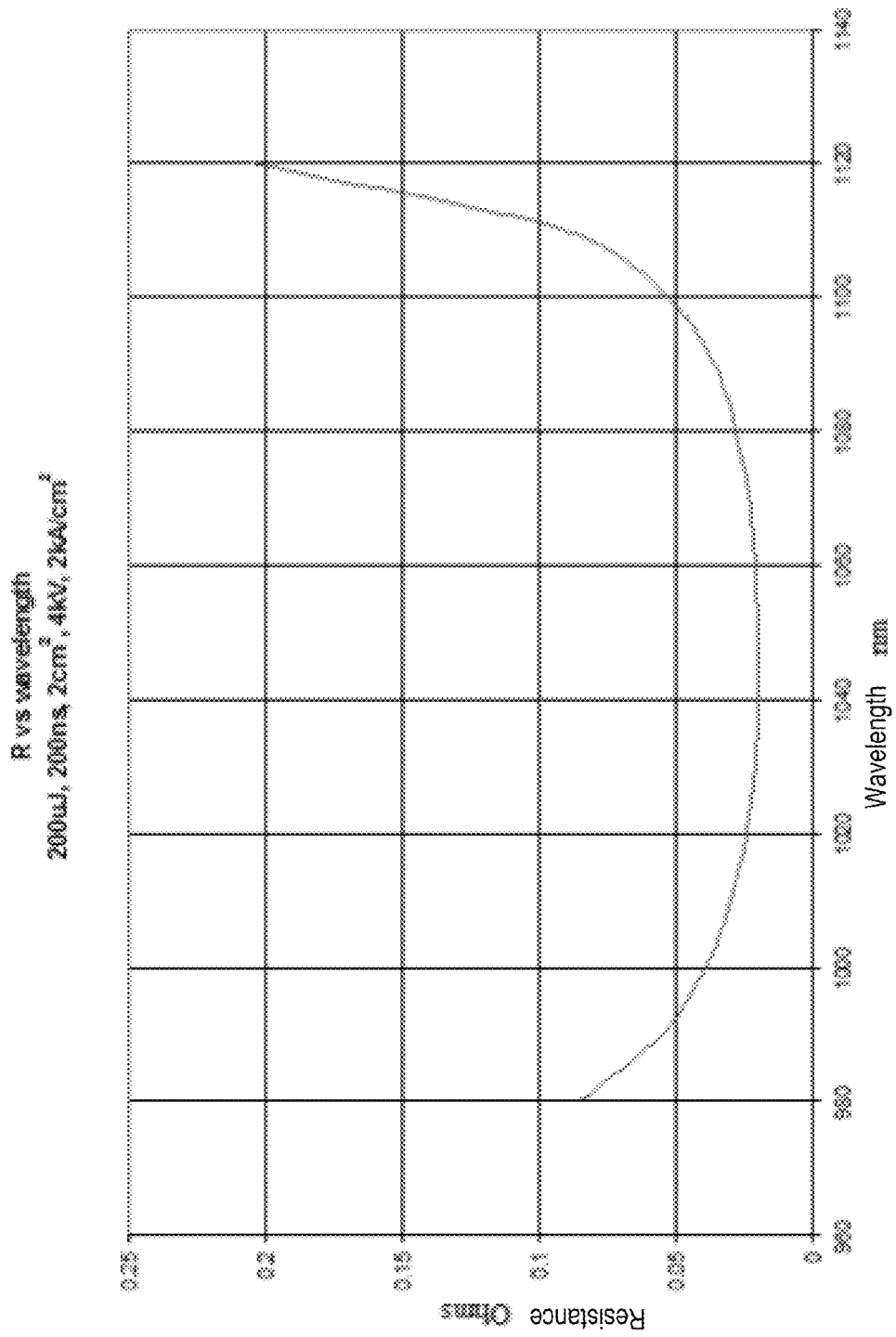
FIG. 7 shows a graph of relative anode resistance versus wavelength.

The optimum wavelength for high switch efficiency is determined by both the number of charge carriers generated and the location of the charge carriers. FIG. 7 shows a graph of resistance versus wavelength. Assuming all the charge carriers are optically generated, for a 660 μm thickness optically gated switch device, optimum results are achieved with a wavelength in the range of 1020 nm-1080 nm, since these wavelengths offer the small amount of resistance. Slightly shorter wavelengths result in greater number of charge carriers, but the distribution across the optically gated switch device varies by more than a factor of ten, resulting in a less efficient switch.

To achieve saturated charge carrier density would require less than 50 μJ of such photons creating charge carriers. However, during turn-on some amount of charge carriers will be generated by thyristor action, so not all of the charge carriers need to be photo-generated. For example, a 1 kW pulse for 40 ns can achieve 5 kA using an appropriately designed thyristor structure. The energy required to achieve saturated charge carrier density is small, but creating these charges in a short time requires a high peak power photon source.

The cost of the photon source is a key driver for the practical application of the optically gated switch device. Four-layer devices can decrease the optical power and energy requirements. In many practical applications, the current rise time is limited by external load. The minimum requirement for the optical power and energy can be determined for specific current and rise time requirements by including thyristor action and the rate at which charge carriers are needed to achieve the desired rise time and switch efficiency, in the calculation. This results in substantially reduced switch costs. Furthermore, by using a four-layer device optimized for fast turn-on, the optical power requirements can be further decreased. Thus, even though the optically gated switch device is turned on promptly from photo-generated charge carriers, it is still desirable to optimize the regenerative characteristics of the optically gated switch device.

The laser diode array can be integrated to the stage such that there is little distance between the semiconductor and the laser emitter. The laser diode array can then be driven using a compact self-powered driver such as described in Applicant's U.S. Pat. No. 6,624,684, herein incorporated by reference.

Figure 8:
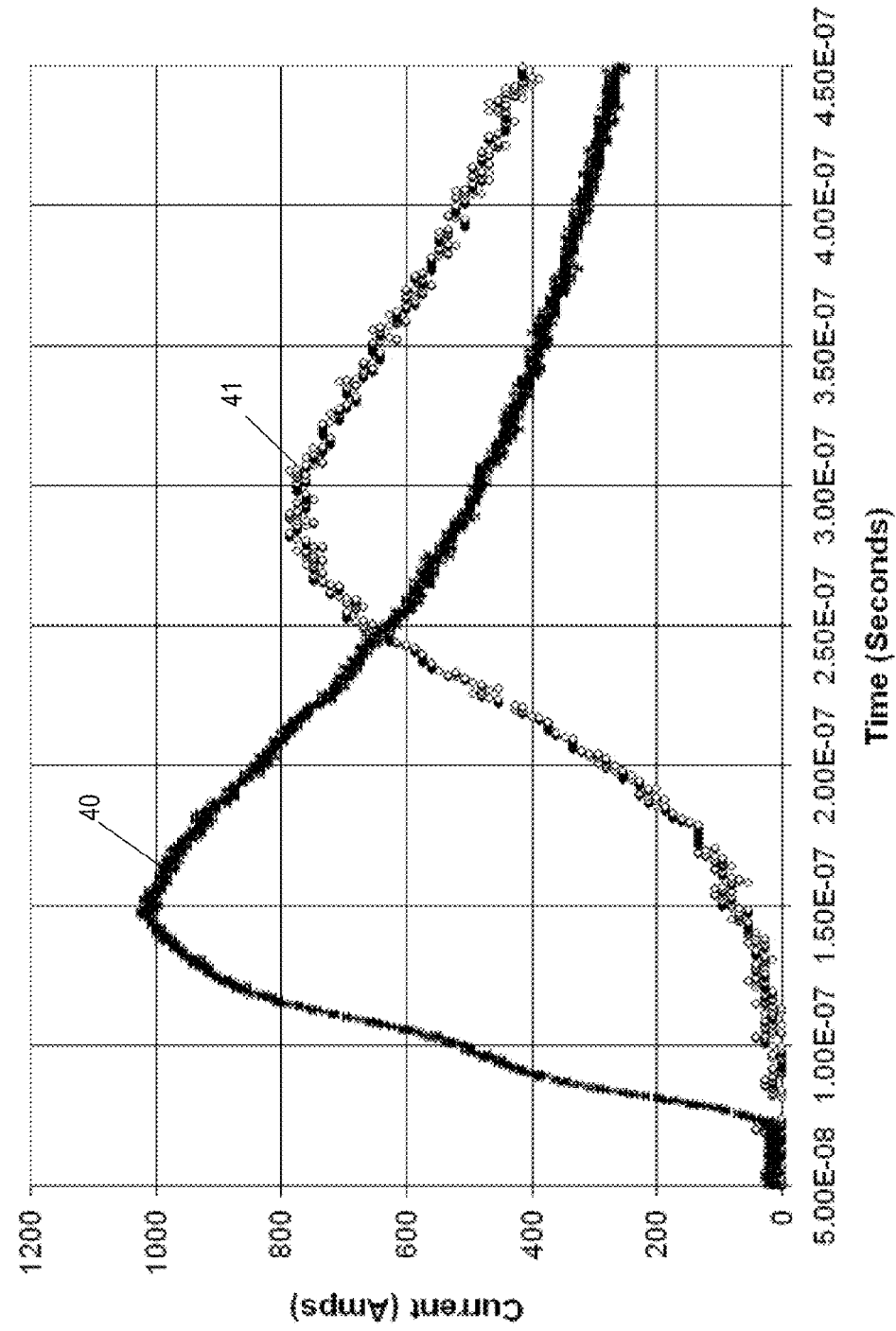
FIG. 8 shows a graph of switch current versus time, comparing electrical triggering to optical triggering of the same device.

FIG. 8 shows a graph of switch current versus time comparing optical (see line 40) to electrical (see line 41) triggering of the same device. As is shown, the optical triggering 40 resulted in a significantly shorter turn-on delay and rise time since optical triggering seeds the whole optically gated switch device with charge carriers, as opposed to the electrical triggering 41 which needs to inject the charge carriers from the gate region which requires transit times across the optically gated switch device to generate sufficient charge carriers for conduction.

Figure 9:
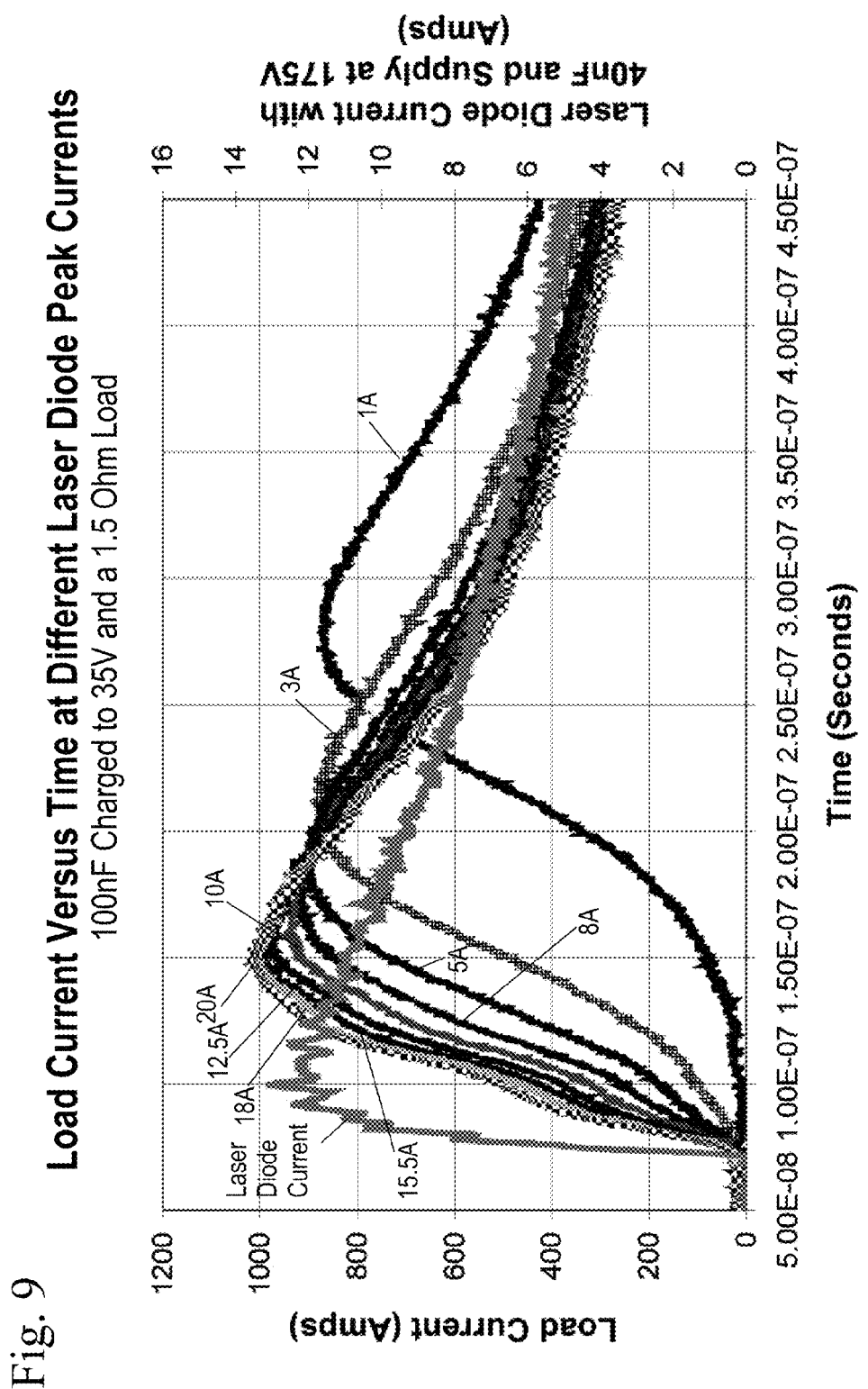
FIG. 9 shows a graph of load current versus time at a range of current levels.

FIG. 9 shows the effects of peak laser diode current on peak switch di/dt. At low current, e.g. 1 A, the results are similar to electrical triggering. At high current, for example 15.5 A, 18 A, and 20 A there is not much further improvement over 5 A, therefore the power requirements of the laser diodes can be limited without major impact on performance.

Figure 10:
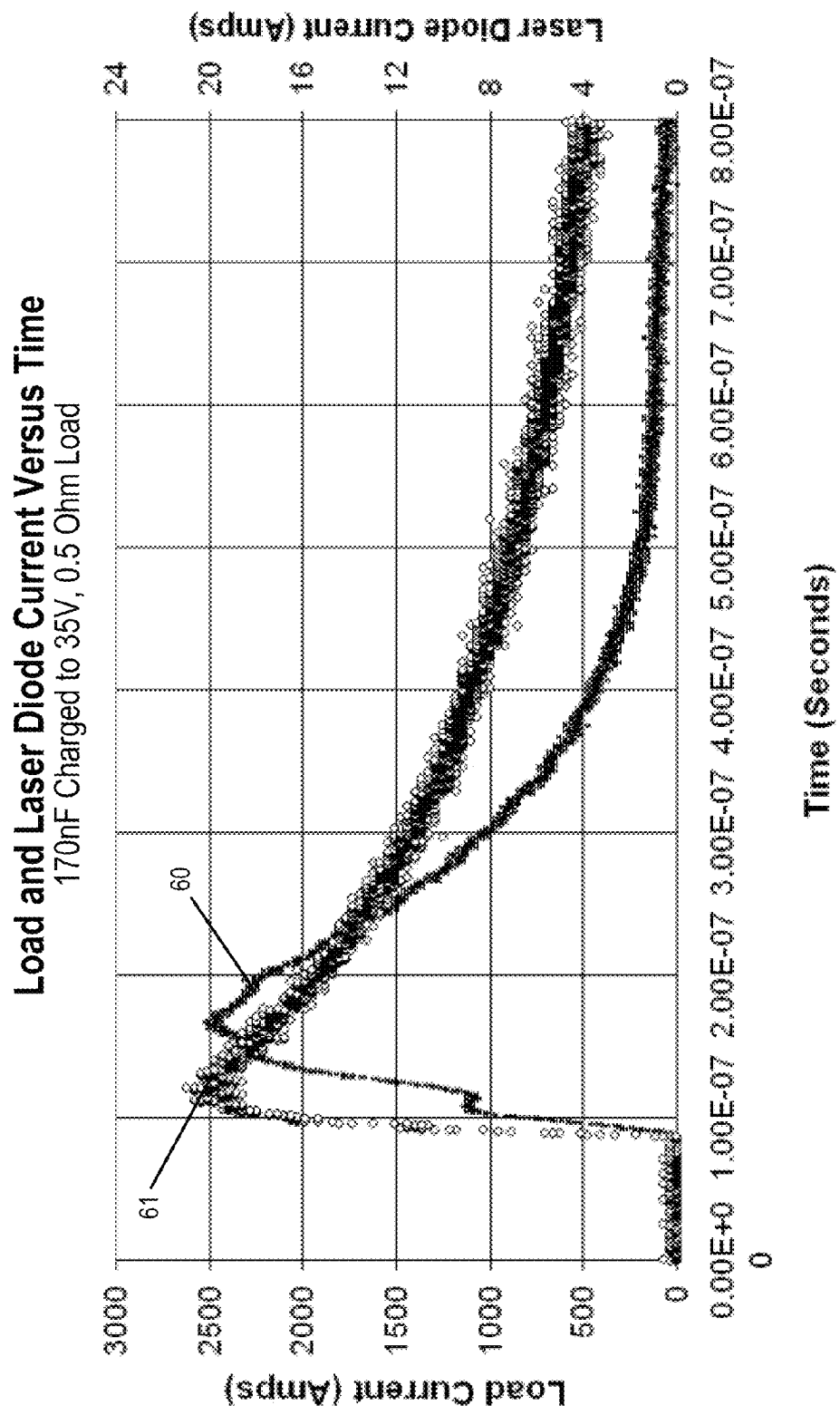
FIG. 10 shows a graph of load current and laser diode current versus time.

FIG. 10 shows switch performance at 2500 A peak switch current 60 versus laser diode array current 61, showing that the peak switch current 60 lags the laser diode trigger current by less than 5 ns, with the lag time being between the initial rise of optical power of the laser diode array current to the initial rise of switch current. Furthermore, the optical power falls well before the switch current 60 reaches peak, showing that maintaining the optical power on from the laser diode array current is not required for switch performance after the initial turn-on time.

FIG. 11a shows a horizontal configuration of optically gated switch devices of an embodiment of the present invention, with each optically gated switch device with a separate photon source 1, preferably an array of laser diodes. The array of photon sources 1, are coupled to the thyristors 3 and photons 2 travel from the array of photon sources 1 to the thyristors 3, which are triggered optically.

The photons 2 enter through a surface of the thyristor 3 through optically flat openings 6 patterned through the anode metallization 4 of the thyristor 3. The photons 2 will generate charge carriers (not shown) throughout the full thickness of the thyristor 3. Opposite the anode metallization 4 of the thyristor 3 is the cathode metallization 5. The external anode connection would be made to the anode metallization 4 and the external cathode connections would be made to the cathode metallization 5. Optical drive power would be provided through connections 7 at the photon source 1. Each of the thyristors 3 are coupled together with stage to stage connections 8 between the cathode metallization 5 of one thyristor to the anode metallization 4 of an adjacent thyristor 3.

Figure 11B:
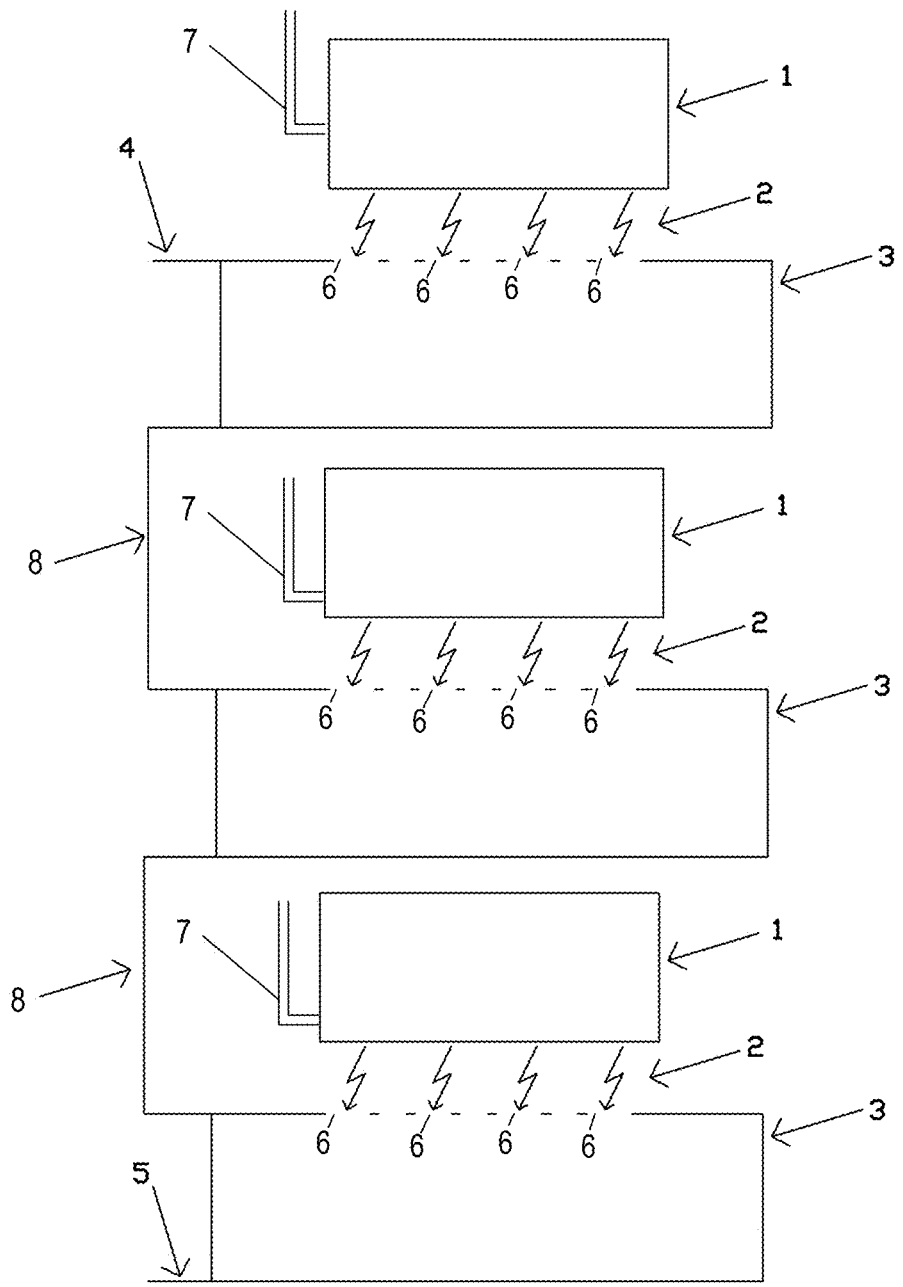
FIG. 11b shows a schematic of a vertical stack configuration of optically gated switch devices of an embodiment of the present invention, with each optically gated switch device with a separate laser diode array.

For series connected stacks, horizontally, as shown in FIG. 11a or vertically, as shown in FIG. 11b, each of the thyristors 3 are at different potentials when the optically gated switch device is in an off state. If the photon sources 1 are at the anode or cathode potential of each stage, then their respective power supplies and input control signals must be isolated. These separate photon sources can be externally powered using appropriate high voltage isolation techniques as known in the art.

Another method providing optically triggering thyristors 3 is to use a self-powered gate drive as described in Applicant's U.S. Pat. No. 6,624,684, which is herein incorporated by reference. A self-powered gate drive uses voltage across the optically gated switch device to power each stage. No other power source is required. The turn-on control signal can be applied to each stage via small high voltage (HV) isolation transformers or by using fiber optics or other optical isolation to trigger a low voltage, low power photo sensitive switch on each stage. The auto trigger described in Applicant's U.S. Pat. No. 7,072,196, hereby incorporated by reference, can also be applied to optically gated switch device of the present invention, where instead of driving the gate of a thyristor the output from the auto triggered gate drive is connected to the photon source either directly or via a self-powered amplifier.

Alternatively, the photon source 1 may be isolated from the thyristor 3 at each stage, so all the photon sources 1 can be at the same potential, eliminating the need for any other HV isolation. The isolation between photon source 1 and thyristor 3 must be sufficient to hold off the largest potential difference in the optically gated switch device, limiting this approach to a few series connected stages.

For optically gates switch devices with a large number of stages or for systems using many optically gated switch devices, it may be advantageous to employ a single light source 110, such as one or more laser diodes, to drive all stages of all optically gated switch devices 111a-111c as shown in FIG. 11c. Light from the light source 110 is coupled to the stages/thyristors 111 with a light guide 9 comprising multiple optical waveguides, light pipes or optical fibers from the source 110 to each stage 111, such that the output of the waveguides, light pipes or fibers 9 forms the photon source 112a-112c for the stage 111a-111c. Each of the stages 111a-111c are coupled together with stage to stage connections 8 between the cathode metallization 5 of one stage to the anode metallization 4 of an adjacent stage. The light sources can be remotely located and can all operate at the same potential. There is no limit to the number of stages that can be connected is series or parallel.

Alternate photon sources can be used, such as high power lasers and light emitting diodes with the same requirements for wavelength, etc as described above. High power sources driving optical waveguides or fiber optics are advantageous for driving multiple stage switches or for driving multiple different optically gated switch devices to insure precise simultaneous turn on. This technique can also be employed to establish precise timing between different switches by using different optical path lengths to each switch.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. An optically triggered semiconductor switch comprising:
    a) an anode metallization layer;
    b) a cathode metallization layer;
    c) a semiconductor between the anode metallization layer and the cathode metallization layer, comprising at least four layers of alternating doping in a form P-N-P-N, in which an outer layer adjacent to the anode metallization layer forms an anode and an outer layer adjacent the cathode metallization layer forms a cathode;
        in which the anode metallization layer has a window pattern of optically transparent material exposing the anode layer to light; wherein the window pattern comprises a plurality of windows of transparent material, each window having a top portion with a width, a bottom portion with a width, the top portion being connected to the bottom portion through a middle portion, wherein a width of the middle portion of the window is greater than the width of the top portion and the bottom portion of the window;
    d) a photon source emitting light having a wavelength, the light emitted from the photon source being configured to match the window pattern of the anode metallization layer.

2. The switch of claim 1 in which the photon source comprises an array of laser diodes located such that light from the laser diodes matches the window pattern of the anode metallization layer.

3. The switch of claim 1 in which the photon source comprises at least one laser diode coupled to a light guide having outputs matching the window pattern of the anode metallization layer.

4. The switch of claim 1, in which the wavelength of the photon source is selected to achieve an even distribution of photo-generated charge carriers throughout a thickness of a device.

5. The switch of claim 1, in which a thickness of the P type layer near the anode side and the N and P type layers on the cathode side are selected to produce the fastest turn-on times.

6. A multi-stage optically triggered semiconductor switch, comprising a plurality of stages coupled in series, each comprising:
    a) an anode metallization layer;
    b) a cathode metallization layer;
    c) a semiconductor between the anode metallization layer and the cathode metallization layer, comprising at least four layers of alternating doping in a form P-N-P-N, in which an outer layer adjacent to the anode metallization layer forms an anode and an outer layer adjacent the cathode metallization layer forms a cathode;
        in which the anode metallization layer has a window pattern of optically transparent material exposing the anode layer to light wherein the window pattern comprises a plurality of windows of transparent material, each window having a top portion with a width, a bottom portion with a width, the top portion being connected to the bottom portion through a middle portion, wherein a width of the middle portion of the window is greater than the width of the top portion and the bottom portion of the window;
    d) a photon source emitting light having a wavelength, the light emitted from the photon source being configured to match the window pattern of the anode metallization layer.

7. The switch of claim 6, wherein the stages are coupled in series and stacked horizontally.

8. The switch of claim 6, wherein the stages are coupled in series and stacked vertically.

9. The switch of claim 6, in which the photon source comprises an array of laser diodes located such that light from the laser diodes matches the window pattern of the anode metallization layer for each of the stages.

10. The switch of claim 6, in which the photon source comprises at least one laser diode coupled to a light guide having outputs matching the window pattern of the anode metallization layer of each of the stages.

11. An optically triggered semiconductor switch comprising:
    a) an anode metallization layer;
    b) a cathode metallization layer;
    c) a semiconductor between the anode metallization layer and the cathode metallization layer, comprising at least four layers of alternating doping in a form P-N-P-N, in which an outer layer adjacent to the anode metallization layer forms an anode and an outer layer adjacent the cathode metallization layer forms a cathode;

in which the cathode metallization layer has a window pattern of optically transparent material exposing the cathode metallization layer to light wherein the window pattern comprises a plurality of windows of transparent material, each window having a top portion with a width, a bottom portion with a width, the top portion being connected to the bottom portion through a middle portion, wherein a width of the middle portion of the window is greater than the width of the top portion and the bottom portion of the window;

d) a photon source emitting light having a wavelength, the light emitted from the photon source being configured to match the window pattern of the cathode metallization layer.

12. The switch of claim 11 in which the photon source comprises an array of laser diodes located such that light from the laser diodes matches the window pattern of the cathode metallization layer.

13. The switch of claim 11 in which the photon source comprises at least one laser diode coupled to a light guide having outputs matching the window pattern of the cathode metallization layer.

14. The switch of claim 11, in which the wavelength of the photon source is selected to achieve an even distribution of photo-generated charge carriers throughout a thickness of a device.

15. An optically triggered semiconductor switch comprising:
 a) an anode metallization layer;
 b) a cathode metallization layer;
 c) a semiconductor between the anode metallization layer and the cathode metallization layer, comprising at least four layers of alternating doping in a form P-N-P-N, in which an outer layer adjacent to the anode metallization layer forms an anode and an outer layer adjacent the cathode metallization layer forms a cathode;
  in which the cathode metallization layer and the anode metallization layer each have a window pattern of optically transparent material exposing the anode metallization layer and the cathode metallization layer to light wherein the window pattern comprises a plurality of windows of transparent material, each window having a top portion with a width, a bottom portion with a width, the top portion being connected to the bottom portion through a middle portion, wherein a width of the middle portion of the window is greater than the width of the top portion and the bottom portion of the window;
 d) a photon source emitting light having a wavelength, the light emitted from the photon source being configured to match the window pattern of the cathode metallization layer and the anode metallization layer.

16. The switch of claim 15 in which the photon source comprises an array of laser diodes located such that light from the laser diodes matches the window pattern of the anode metallization layer and the cathode metallization layer.

17. The switch of claim 15 in which the photon source comprises at least one laser diode coupled to a light guide having outputs matching the window pattern of the anode metallization layer and the cathode metallization layer.

18. The switch of claim 15, in which the wavelength of the photon source is selected to achieve an even distribution of photo-generated charge carriers throughout a thickness of a device.

19. A multi-stage optically triggered semiconductor switch, comprising a plurality of stages coupled in series, each comprising:
 a) an anode metallization layer;
 b) a cathode metallization layer;
 c) a semiconductor between the anode metallization layer and the cathode metallization layer, comprising at least four layers of alternating doping in a form P-N-P-N, in which an outer layer adjacent to the anode metallization layer forms an anode and an outer layer adjacent the cathode metallization layer forms a cathode;
  in which the anode metallization layer and the cathode metallization layer each have a window pattern of optically transparent material exposing the cathode metallization layer and the anode metallization layer to light wherein the window pattern comprises a plurality of windows of transparent material, each window having a top portion with a width, a bottom portion with a width, the top portion being connected to the bottom portion through a middle portion, wherein a width of the middle portion of the window is greater than the width of the top portion and the bottom portion of the window;
 d) a photon source emitting light having a wavelength, the light emitted from the photon source being configured to match the window pattern of the anode metallization layer and the cathode metallization layer.

20. The switch of claim 19, wherein the stages are coupled in series and stacked horizontally.

21. The switch of claim 19, wherein the stages are coupled in series and stacked vertically.

22. The switch of claim 19, in which the photon source comprises an array of laser diodes located such that light from the laser diodes matches the window pattern of the anode metallization layer and the cathode metallization layer for each of the stages.

23. The switch of claim 19, in which the photon source comprises at least one laser diode coupled to a light guide having outputs matching the window pattern of the anode metallization layer and the cathode metallization layer of each of the stages.

* * * * *